United States Patent [19]
Williams

[11] Patent Number: 5,248,627
[45] Date of Patent: Sep. 28, 1993

[54] THRESHOLD ADJUSTMENT IN FABRICATING VERTICAL DMOS DEVICES

[75] Inventor: Richard K. Williams, Cupertino, Calif.

[73] Assignee: Siliconix Incorporated, Santa Clara, Calif.

[21] Appl. No.: 854,162

[22] Filed: Mar. 20, 1992

[51] Int. Cl.[5] .......................................... H01L 21/266
[52] U.S. Cl. ........................................ 437/45; 437/30; 437/149; 148/DIG. 126
[58] Field of Search ................. 437/27, 28, 29, 30, 437/45, 77, 148, 149, 150, 153, 154, 953, 958; 148/DIG. 126, DIG. 145

[56] References Cited

U.S. PATENT DOCUMENTS

| | | | |
|---|---|---|---|
| 4,329,186 | 5/1982 | Kotecha et al. | 437/45 |
| 4,443,931 | 4/1984 | Baliga et al. | 437/149 |
| 4,757,032 | 7/1988 | Contiero | 437/150 |
| 4,810,665 | 3/1989 | Chang et al. | 437/149 |
| 4,845,047 | 7/1989 | Holloway et al. | 437/45 |
| 4,902,636 | 2/1990 | Akiyama et al. | 437/45 |
| 4,931,408 | 6/1990 | Hshieh | 148/DIG. 126 |

Primary Examiner—Tom Thomas
Assistant Examiner—C. Chaudhari
Attorney, Agent, or Firm—Skjerven, Morrill, MacPherson, Franklin & Friel

[57] ABSTRACT

A process for fabricating a p-channel VDMOS transistor includes a high temperature, long diffusion subsequent to deposition of the polysilicon gate for forming body regions. The threshold voltage of the VDMOS devices is adjusted subsequent to both gate formation and the high temperature, long duration body diffusion by implanting a suitable p-type dopant into the VDMOS channel through the insulated gate, after formation thereof. Since the gate is formed prior to threshold adjust, high temperature processing and long duration diffusions requiring the presence of the gate may be completed prior to threshold adjust, without risk to the adjusted device threshold.

10 Claims, 8 Drawing Sheets

THRESHOLD ADJUSTMENT IN FABRICATING VERTICAL DMOS DEVICES

BACKGROUND OF THE INVENTION

1. Field of the Invention

The present invention pertains to a method for adjusting a semiconductor device threshold voltage during device fabrication, and more particularly to adjusting the threshold voltage of a vertical double diffused MOSFET ("VDMOS") transistor during fabrication by high energy ion implantation through the gate thereof.

2. Description of Related Art

The threshold voltage $V_t$ for MOSFET transistors is defined as the voltage $V_{gs}$ applied between gate and source, below which the MOS transistor drain-to-source current $I_{ds}$ becomes zero. The threshold voltage for n-channel and p-channel devices are denoted $V_{tn}$ and $V_{tp}$, respectively. The threshold voltage is a function of a number of parameters, including the gate material, the gate insulation material, the gate insulator thickness, the channel doping, the impurities at the silicon-insulator interface, and the voltage $V_{sb}$ between the source and substrate.

In particular, in double diffused transistors, the net channel concentration is formed by the sequential diffusion of source and body implants self-aligned to a polysilicon gate. Without the use of self-alignment to the gate, an unacceptable variation in $V_t$ will result. Reduction in the threshold voltage of a DMOS transistor may be achieved by lowering the body implant dose, which reduces the effective channel concentration, or by driving the source deeper to compensate a greater portion of the body doping profile. Another approach is to make the body diffusion shallow relative to the source diffusion, so that the body diffusion concentration is compensated by the source diffusion concentration.

Adjusting the threshold by these means is limited by a number of potentially adverse or catastrophic complications in the device. As the net body concentration is reduced, the likelihood of punch through breakdown is exacerbated. This limitation can be particularly troublesome in lower voltage DMOS (e.g. 20 volt to 60 volt breakdowns) where the depletion spreading in the body from the reverse-biased drain to the body junction is significant. Beyond punch through problems, lighter net body doping results in an increase in the parasitic bipolar gain of the bipolar transistor formed by the source acting as the emitter, the body acting as the base, and the drain acting as the collector. In an n-channel vertical DMOS, a parasitic NPN transistor is present, whereas in a p-channel DMOS, a parasitic PNP transistor is present. The effect of this parasitic transistor is to cause potentially destructive snap-back breakdown, since the $BV_{ceo}$ breakdown of the bipolar transistor is lower than the $BV_{DSS}$ of the MOSFET transistor (equivalent to the $BV_{CES}$ in the bipolar). Decreasing the net charge in this parasitic base both increases the parasitic bipolar gain, thereby lowering the snap-back voltage; and increases the base resistance, thereby making the bipolar transistor easier to turn on. Moreover, as junctions are scaled to more shallow dimensions, the sensitivity of the net charge to process variations is increased. The net effect of low body doping, then, is an increased sensitivity to snap-back, a decrease in the safe operating area of the device, a possible reduction in the break down of the device, and a reduction in the ruggedness capability (i.e. the ability to survive an unclamped inductive switching ("UIS") transient.

Generally, therefor, a vertical DMOS is made robust by using a higher body concentration, not a lower value. Unfortunately, a higher body concentration corresponds to higher thresholds. This problem is particularly true for p-channel DMOS transistors, which have a higher threshold for a given channel concentration than a comparable n-channel DMOS. The higher threshold occurs as a result of the positive charge in the oxide and the gate to silicon work function, particularly when an N-type polysilicon gate is used. The higher threshold is a particular disadvantage in low gate drive applications such as applications in which the MOS gate drive supply voltage is 5 volts or below. Moreover, a high threshold for a p-channel DMOS transistor further degrades performance relative to the n-channel DMOS transistor, particularly since p-channel devices are less efficient due to the mobility effect alone.

Known techniques for threshold adjust are not entirely satisfactory for use in VDMOS processes, and particularly in p-channel DMOS. Channel doping is a well known technique for threshold adjustment. Channel doping involves varying the doping concentration at the silicon-insulator interface. In CMOS processes, channel doping typically is done prior to deposition of the gate polysilicon. Generally, the technique is not applicable to processes in which two and possibly more successive diffusions are used, such as processes that include steps for fabricating DMOS devices in which a body region must be diffused deeper than a source. Specifically, in a vertical DMOS transistor, the channel region requiring threshold adjusting is double-diffused. Impurity distribution in diffusion processes is dependent on the product of the diffusion coefficient $D(T)$ and the time, or $\sqrt{Dt}$ (hereinafter "root Dt"). In double diffused MOSFET devices, the root Dt is large, ranging from 0.3 or 0.4 microns all the way down to 1.0 or 1.5 microns. When exposed to such large root Dt values, the threshold dopant diffuses too deeply into the double-diffused channel, forming a leakage path between the diffused source and the epitaxial drain of the vertical DMOS MOSFET which is not pinched off at $V_{gs}=0$.

The necessity for using only low temperature processing following the channel doping step has been a significant motivating factor in classical VLSI and integrated circuit process design. Unfortunately, conventional techniques of threshold adjusting prior to gate formation are incompatible with the self-aligned double diffused MOSFET.

Another conventional technique for reducing $V_{tp}$ of a PMOS device, one which is useful even in processes having long diffusion times after the polysilicon deposition step, is to use boron-doped p-type polysilicon gates in association with the PMOS devices, instead of phosphorus-doped n-type polysilicon gates. The p-type polysilicon has a different work function, so that the threshold of the PMOS devices is shifted by about a volt. Unfortunately, this technique is not entirely satisfactory for use in processes specifying a thin gate oxide, as the boron from the p-type polysilicon penetrates easily through the thin gate oxide in any subsequent diffusion steps and can counterdope the channel. Leakage and other problems result. Moreover, this problem is exacerbated by the presence of hydrogen. While the risk is reduced by the use of a thicker gate oxide, say on the order of 1000 Å, the requirement for a thicker gate oxide compromises process flexibility and device performance.

A need, therefor, exists for a technique for adjusting the $V_t$ of VDMOS FET devices and in particular p-channel VDMOS devices while preserving the ability to use long diffusion and high temperature steps subsequent to polysilicon gate deposition.

SUMMARY OF THE INVENTION

To adjust the threshold voltage of an insulated gate device in a VDMOS semiconductor fabrication process, an implant of a suitable dopant is made into the channel through the insulated gate, after formation thereof. Since the gate is formed prior to threshold adjust, high temperature processing and long diffusions requiring the presence of the gate may be completed without risk to the adjusted device threshold.

DETAILED DESCRIPTION OF THE PREFERRED EMBODIMENT

While the following discussion is in the context of a p-type threshold adjust implant into a p-channel VDMOS device, the discussion is generally applicable to other species, including n-type.

Figure 1:
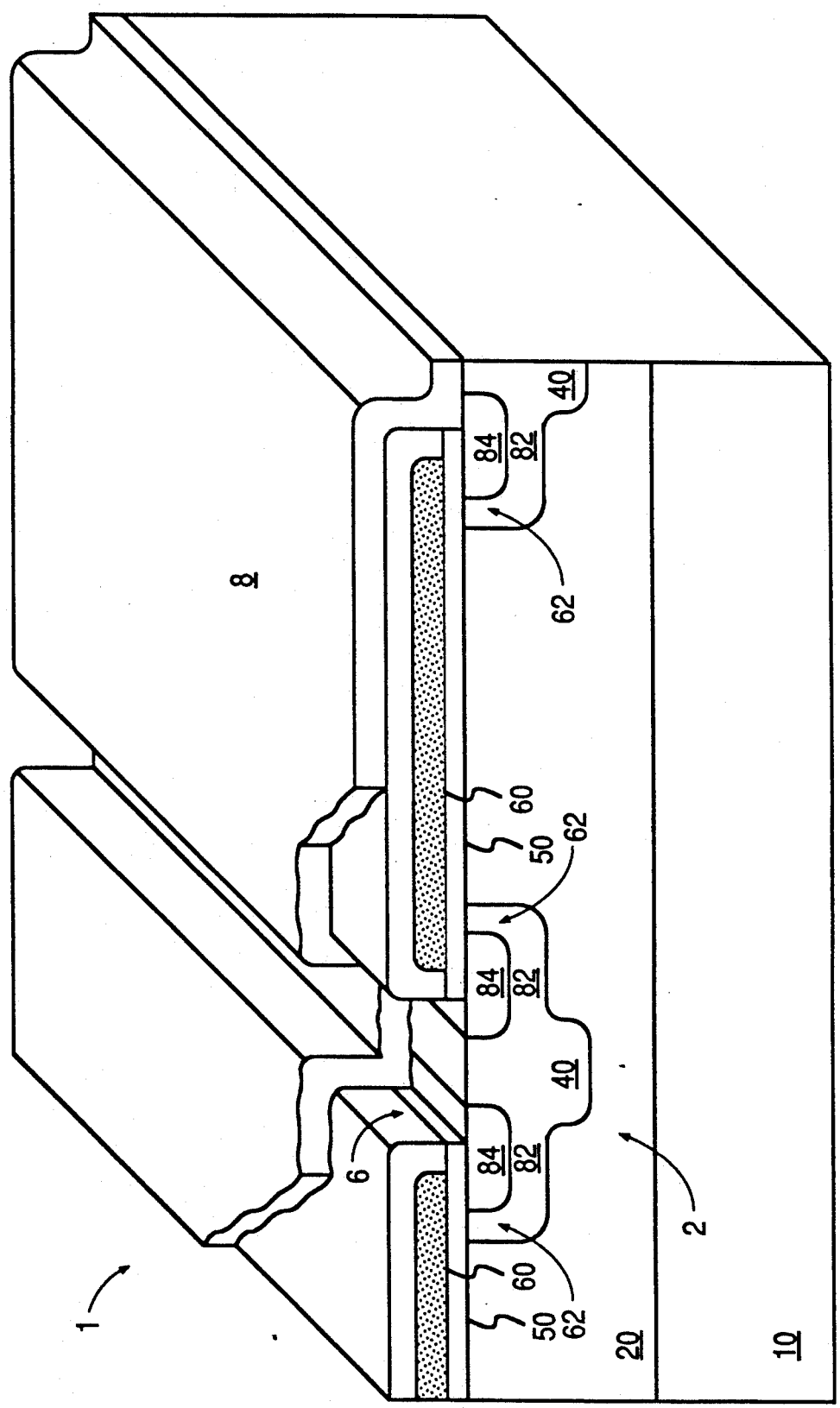
FIG. 1 is a cross-sectional, three dimensional view of a variously cut-away completed VDMOS field effect transistor 1, showing a stripe-type structure and the completed device regions.

FIG. 1 is a cross-sectional, three dimensional view of a variously cut-away completed VDMOS field effect transistor 1, showing a stripe-type structure and the completed device regions. Other types of VDMOS transistors in common use include cellular arrangements having hexagonal and square cells. The process for forming the VDMOS of FIG. 1 is as follows.

Figure 2:
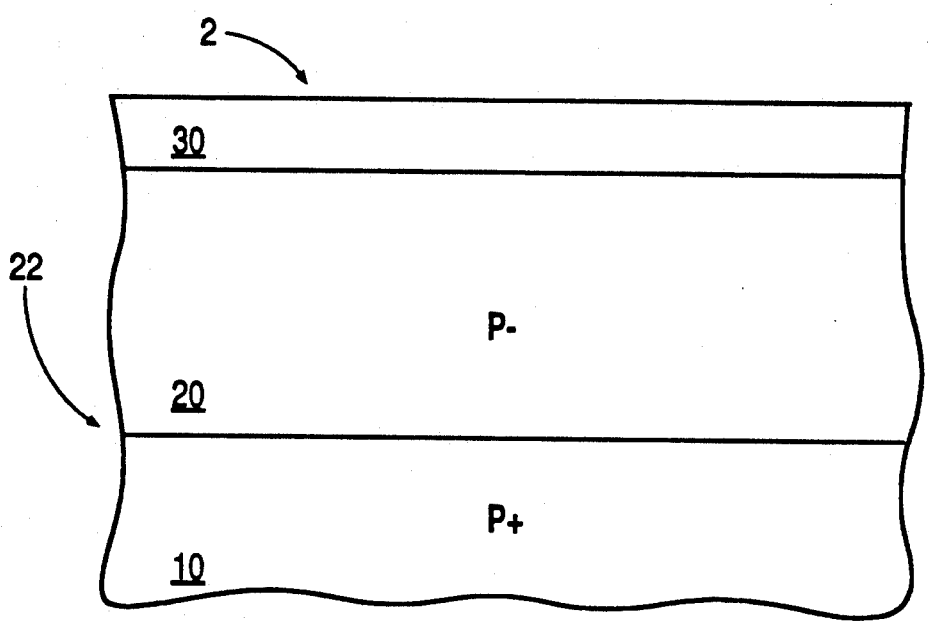
FIGS. 2–7 are cross-sectional views of a p-channel VDMOS strip in successive stages of fabrication in accordance with a VDMOS fabrication process.

Refer to the structure of an illustrative stripe 2 shown in FIG. 2. The slice or wafer 10 on which the VDMOS FET is fabricated has a <100> orientation, and is typically silicon heavily doped with a suitable p-type dopant such as boron at a concentration generally from $1 \times 10^{18}$ to $8 \times 10^{19}$ atoms/cm$^3$. After cleaning and polishing, a p-type epitaxial silicon layer 20 is grown on the wafer 10 to a thickness generally from 3 to 60 microns and doped with a suitable p-type dopant such as boron at a concentration generally from $5 \times 10^{16}$ to $1 \times 10^{14}$ atoms/cm$^3$, dependent on the intended voltage rating of the device. The wafer 10 and epitaxial layer 20 form a semiconductor body 22 for the subsequent formation of active devices. The surface of the epitaxial layer 20 is oxidized for the first masking process, forming an oxide 30 of a thickness generally from 0.3 to 2 microns. Oxide 30 typically is thermally grown.

Figure 3:
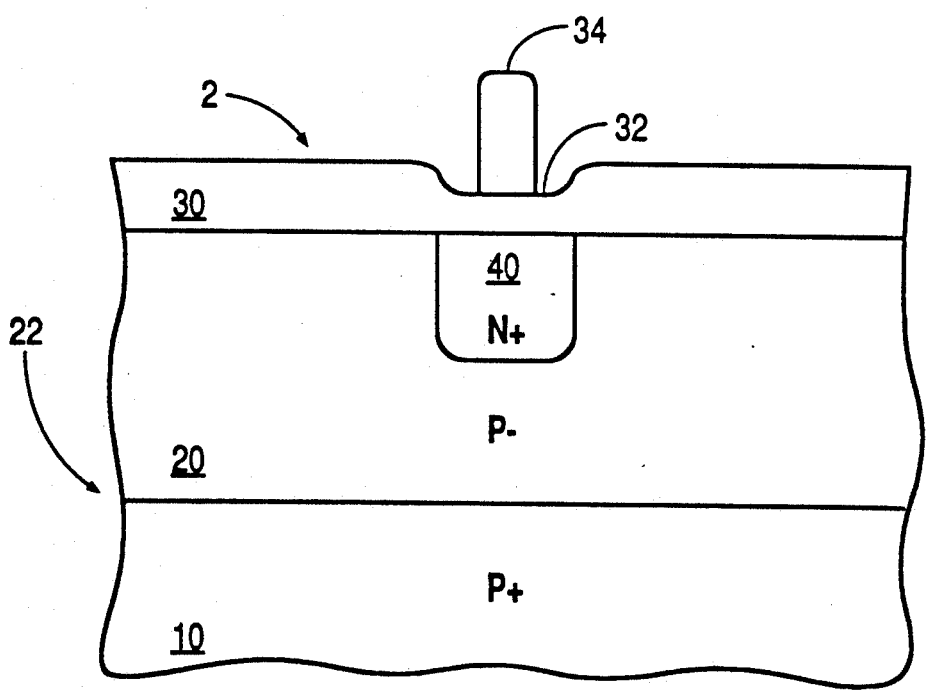

Refer now to the structure of the illustrative stripe 2 of FIG. 3, shown in a successive stage of fabrication. A photoresist layer (not shown) is deposited and patterned to define the n-type wells 40 in the epitaxial layer 20 of the substrate 22 that ultimately connect the body regions 82 of the completed VDMOS 1 to the source metallization 8 of the VDMOS 1 (FIG. 1). The oxide is etched in any suitable manner to form windows to the epitaxial layer 20, and the photoresist is stripped. A suitable n-type dopant such as phosphorus is implanted through each of the windows at a dose generally from $6 \times 10^{14}$ to $10^{16}$ atoms/cm$^2$ and an energy generally from 60 to 120 keV, and is driven in to form a deep n+ region 40 that forms a junction at a depth of about 2 microns, for example, into the epitaxial layer 20. During the drive-in, an oxide 32 forms over the region 40. A photoresist layer 34 is deposited and patterned so as to overlay at least a portion of the oxide region 32.

Figure 4:
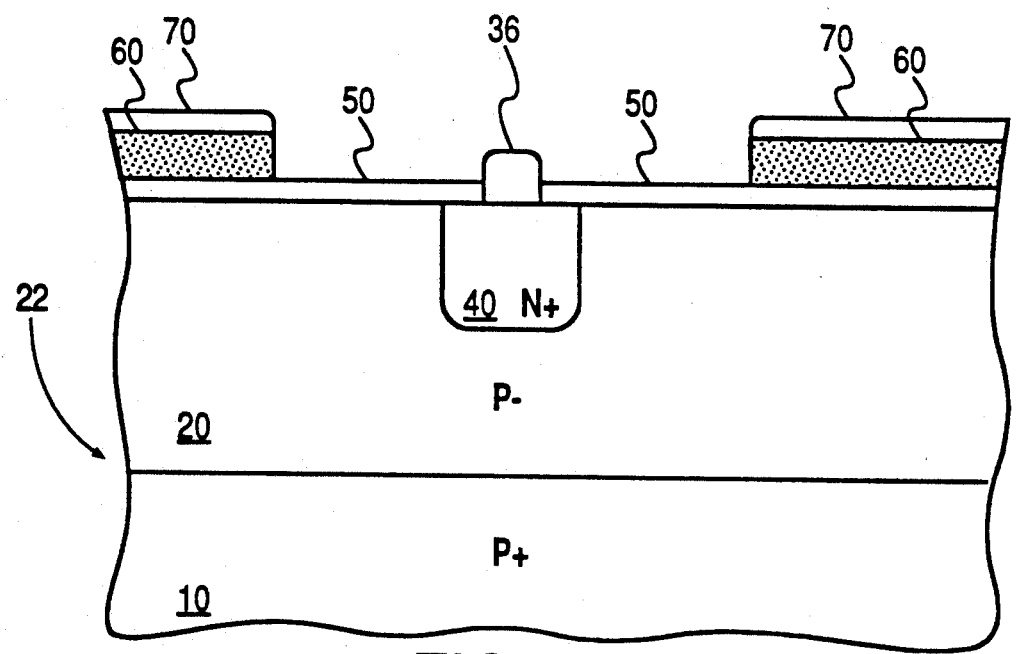

Refer now to the illustrative stripe 2 of FIG. 4, shown in a successive stage of fabrication. The oxide 30 and any exposed portions of the oxide 32 are etched in any suitable manner to form protective oxide cap 36 over the deep n+ region 40, and the photoresist 34 is stripped. A uniform, high integrity gate oxide 50 is grown, typically in a dry thermal oxidation to a thickness generally from 100 Å to 1200 Å. A polysilicon film 60 is deposited on the gate oxide 50, typically to a thickness of about 5000 Å. The polysilicon film 60 is heavily doped with a suitable n-type dopant such as phosphorus to achieve a sheet resistance of about 35 ohm/square, for example. A mask oxide 70 is formed over the polysilicon 60, typically by low-pressure chemical vapor deposition, followed by the deposition of a photoresist layer (not shown). The photoresist is patterned and the mask oxide 70 is etched to create a mask for the subsequent self-aligned double diffusions. The photoresist is stripped. The polysilicon 60 is etched through the mask oxide 70 to form a stripe-like gate structure having stripe-like windows for the subsequent double diffusion.

Figure 5:
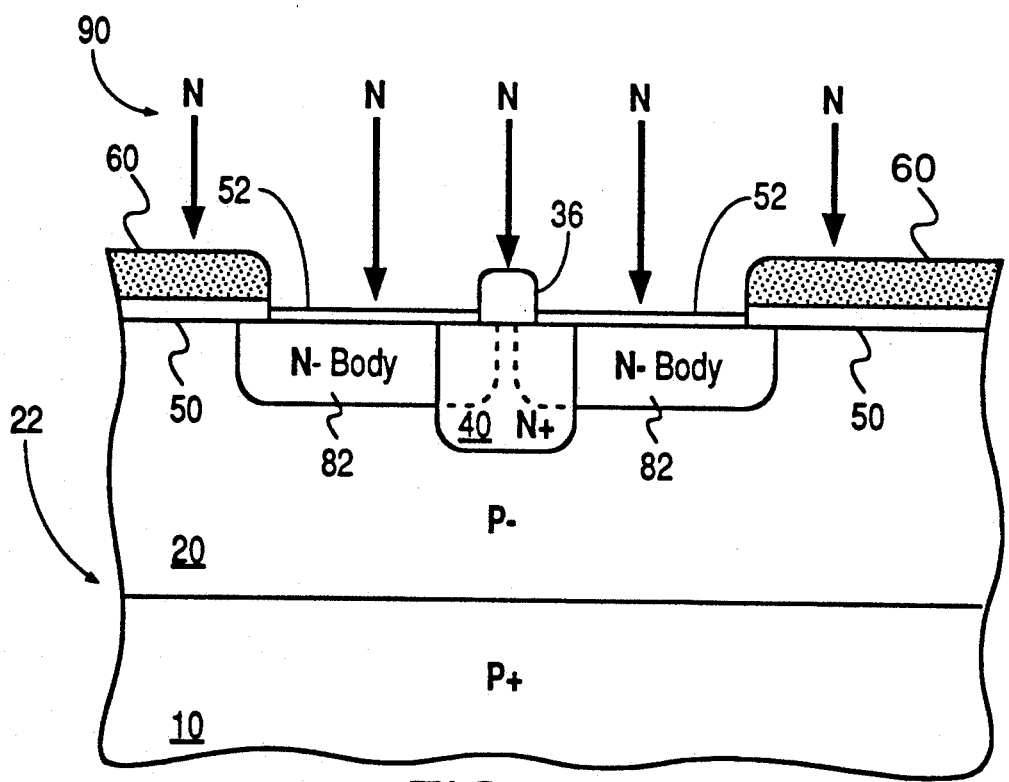

Refer now to the illustrative stripe 2 of FIG. 5, shown in a successive stage of fabrication. The mask oxide 70 is etched in any suitable manner to remove portions of the oxide 50 not covered by the polysilicon 60, but to leave behind at least some of the thicker oxide cap 36. Using the polysilicon 60 and the cap 36 as mask features, an implant 90 is made using a suitable n-type material such as phosphorus at a dose generally from $1 \times 10^{13}$ to $1 \times 10^{14}$ atoms/cm$^2$ and an energy generally from 60 to 120 keV, and the implant 90 is driven in using a suitable furnace for a time generally from 60 to 600 minutes at a temperature generally from 1000° to 1200° C. The pn junction of the body region 82 extends into the epitaxial layer 20 to a depth of about 2.5 microns, for example, and extends laterally under the edge of the polysilicon gate 60 and the cap 36 a distance of about 2 microns, for example. A thin oxide 52 also forms over the major part of the body region 82. Although not shown in the drawings the thin oxide also extends over polysilicon 60.

Figure 6:
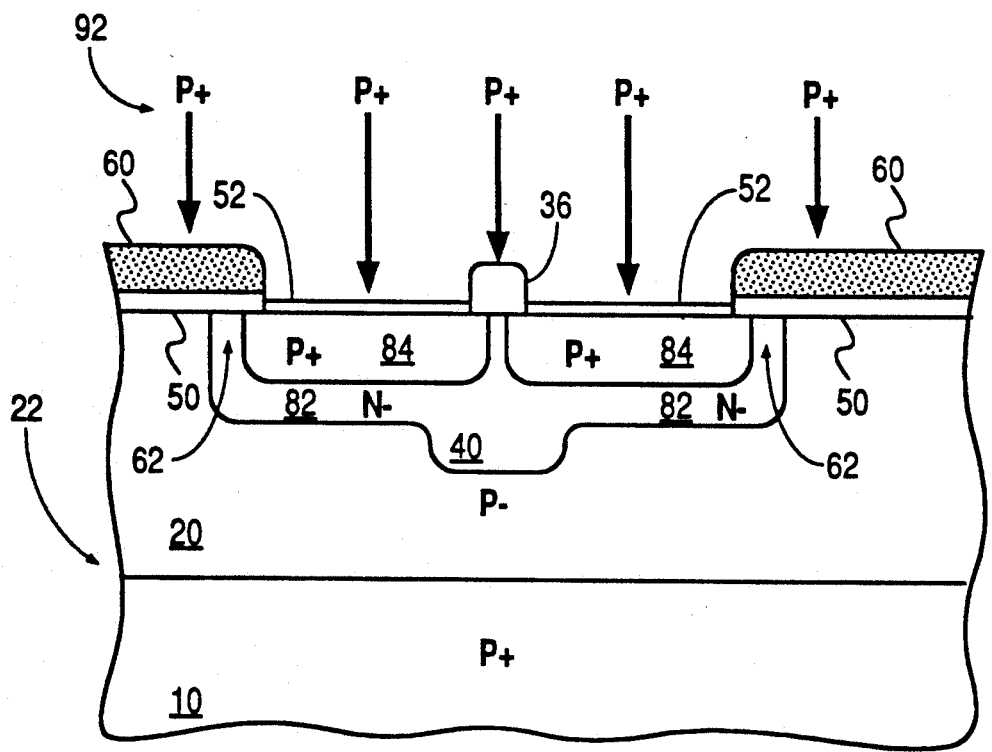
Figure 7:
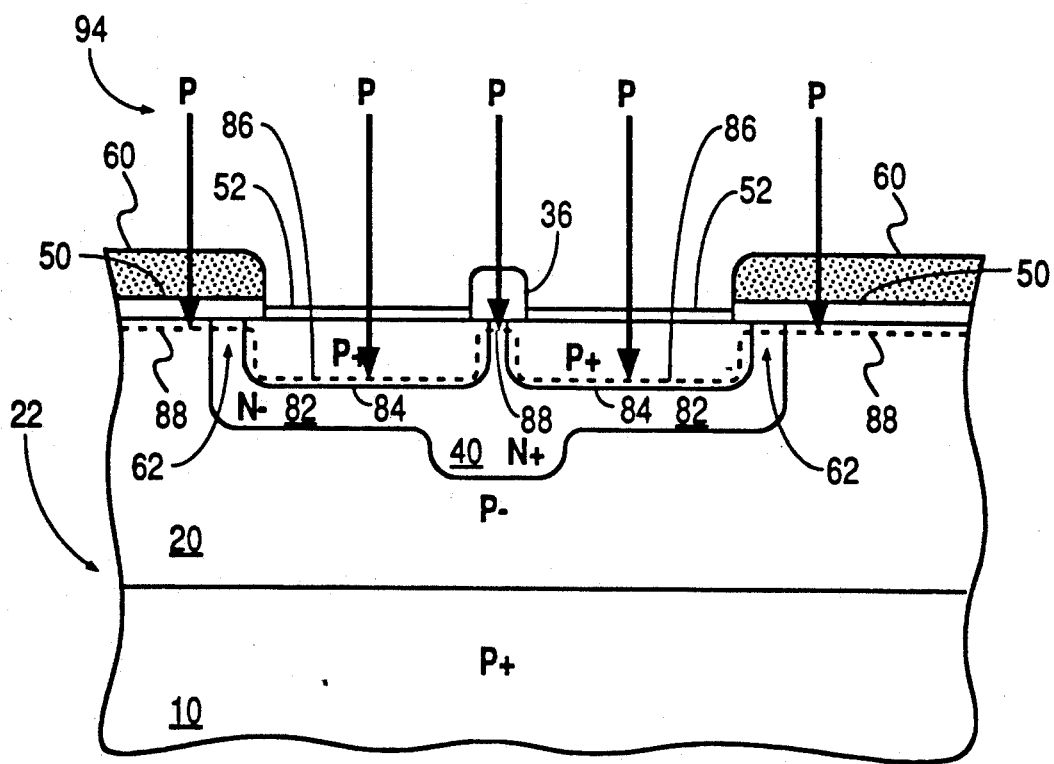

FIGS. 6 and 7 represent two p-type implant operations, a source implant 92 and a threshold adjust implant 94 respectively. The source implant 92 may precede the threshold adjust implant 94 as shown, or vice versa. FIG. 6 shows the formation of source region 84. A suitable p-type dopant such as boron is implanted through the mask provided by the polysilicon gate 60, at a dose generally from $3 \times 10^{14}$ to $8 \times 10^{15}$ atoms/cm$^2$ and an energy generally from 40 to 100 keV. The source dopant is driven in for a time generally from 20 to 60 minutes and at a temperature generally from 950° to 1100° C. to form VDMOS source 84 in the strip 2. The source 84 is self-aligned with the polysilicon gate 60 and the oxide cap 36, and forms a channel region 62 near the surface of the epitaxial layer 20 between the p+n− junction defined by the source 84 and body 82, and the n−p− junction defined by the body 82 and the p− region of epitaxial layer 20. The pn junction of the source 84 extends into the epitaxial layer 20 to a depth of about 1 micron, for example, and extends laterally under the edge of the polysilicon gate 60 and the cap 36 a distance of about 0.8 microns, for example.

FIG. 7 shows the making of a high energy p+ threshold adjust implant 94 through the same mask, the polysilicon gate 60, as is used for the source implant 92. A suitable p-type dopant such as boron is implanted. The general and specific considerations involved in setting the various process conditions for the threshold adjust implant 94 are now described.

It will be appreciated that the depth to which an ion becomes implanted is proportional to its kinetic energy. The implanted distribution in an amorphous target is roughly a Gaussian distribution characterized by a mean, known as the range, and a standard deviation, known as the straggle. In a single crystal target, the range and straggle for a given implant may be different than that in amorphous material, due to a phenomena known as channeling. Higher ion energy, higher silicon temperature, and the growth of silicon dioxide layers on the silicon all tend to dechannel implants. In any event, range and straggle data for various materials including silicon, silicon dioxide, and photoresist have been determined and reported in such reference works as 0. D. Trapp, R. A. Blanchard, L. J. Lopp, and T. I. Kamins, Semiconductor Technology Handbook, 1985, and are incorporated herein by reference.

Generally, in regions of the semiconductor body 22 having field oxide (not shown), neither the source implant 92 nor the threshold adjust implant 94 penetrates through the field oxide into the epitaxial layer 20 of the substrate 22. Hence, regions of substrate overlaid by field oxide are unaffected by the source and threshold adjust implants 92 and 94. Therefor the threshold adjust can be performed without the penalty of an additional mask and its associated cost.

Figure 8:
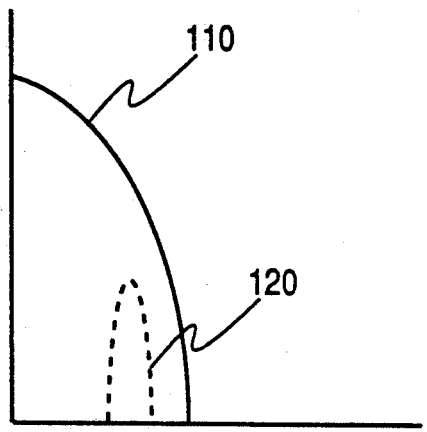
FIG. 8 is a graph of p-type dopant profiles in the source region of the VDMOS strip, resulting from the implants shown in FIGS. 6 and 7.

In the source region 84, both the source implant 92 and the threshold adjust implant 94 penetrate into the substrate 22. As the threshold adjust implant 94 is made with higher energy, it penetrates more deeply into the substrate 22 than the source implant 92. The region of peak concentration resulting from the threshold adjust implant 94 is generally shown by the dashed line identified by reference numeral 86. The range 86 of the threshold adjust implant 94 is affected by the source implant 92. If the source implant 92 is made first, as shown, the range 86 of the threshold adjust implant 92 is somewhat reduced because it must pass through portions of the substrate 22 amorphized by the source implant 92. In other words, channeling is reduced. In any event, the threshold adjust implant 94 is of little practical significance in the source region 84, since the relatively heavy dose implanted in the source implant 92 tends to diffuse deeply and supersede the relatively light concentration of the $V_{tp}$ implant. This is shown in the graph of FIG. 8, in which curve 110 represents the profile of the dopant implanted in the source implant 92 after diffusion, and curve 120 represents the post-diffusion profile of the dopant implanted in the threshold adjust implant 94. Hence, under many process conditions, the device source region is for all practical purposes determined by the source implant 20 alone. The $V_{tp}$ adjust implant may not even appear in the tail distribution.

The regions of stripe 2 under the polysilicon gate 60 and oxide 50, and under the oxide cap 36, are not materially affected by the source implant 92. Although source implant 92 is of a high dose, it is made with insufficient energy to penetrate either the polysilicon gate 60 and oxide 50, or the oxide cap 36.

The region of stripe 2 under oxide cap 36 is not affected by the high energy implant 94. Although the implant 94 penetrates the oxide cap 36, its concentration is negligible in comparison to the deep n+.

The region of stripe 2 under the polysilicon gate 60 outside of the channel region 62 is not affected by the high energy implant 94. Although the implant 94 penetrates the polysilicon 60 and gate oxide 50 and increases the conductivity near the surface of the epitaxial layer 20 outside of the body region 82, the effect is significant neither when the transistor 1 is ON nor when the transistor 1 is OFF. When transistor 1 is ON, the surface is naturally accumulated beyond the conductance of the implant layer itself. Moreover, in low voltage devices the epitaxial layer is sufficiently doped to make the effect of the implant negligible. When transistor 1 is OFF, the implant is sufficiently light to avoid affecting the breakdown or field.

Figure 9:
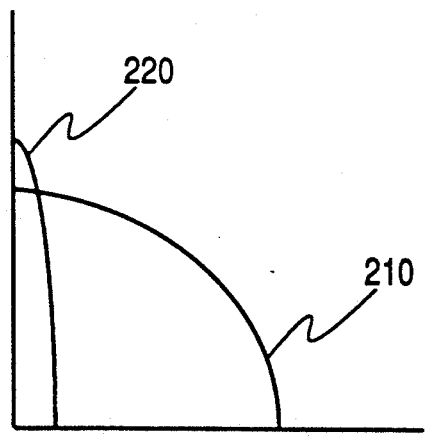
FIG. 9 is a graph of an ideal p-type dopant profile under the gate region of the VDMOS strip of FIG. 1, resulting from the implant shown in FIG. 7; and a profile of a conventional channel doping operation after a subsequent body diffusion.

The effect in the channel region 62 under the polysilicon gate 60 is quite different. The high energy threshold adjust implant 94 penetrates the polysilicon 60 and oxide 50 and enters into the channel region 62 of the stripe 2. The energy of the threshold adjust implant 94 preferably is set so that the implant peak 88 of the dopant implanted through the polysilicon 60 and oxide 50 is within the epitaxial layer 20 but very close to the surface thereof. This is shown in the graph of FIG. 9, in which curve 220 represents the post-diffusion profile of the dopant implanted in the threshold adjust implant 94. The total charge from the ionized implant present in the silicon is $$\frac{Q}{A} = \int_0^X N(x)dx \qquad (1)$$

where Q/A is the dose penetrating into the silicon. As long as the charge remains within electrostatic control of the gate, the degree of threshold adjust is $V_{tp} \approx (Q/A)/C_{ox}$, and is not dependent on the surface concentration charge.

Compare curve 220 representing the profile of the dopant implanted in the threshold adjust implant 94 with curve 210 representing the post-diffusion profile of a dopant implanted in a conventional pre-polysilicon deposition $V_{tp}$ adjust subjected to a body and base diffusion. It will be appreciated that the electrostatic control of the gate must reach much deeper in a device having the $V_{tp}$ adjust profile 210 than a device having the $V_{tp}$ adjust profile 220.

The controllability of the high energy threshold adjust implant depends on three parameters to determine the net charge incorporated into the silicon channel region. These parameters are (a) the thicknesses of the polysilicon gate and gate oxide films; (b) the implant energy; and (c) the implant dose. We have found that the dominant source of variability is the thickness control of the polysilicon and oxide, the blocking coefficients of which are similar to one another, to a first order. Implant energies below about 210 keV show a significant dependence on polysilicon and oxide thickness for the typical combined gate thickness of 0.5 um used in vertical DMOS processes. In contrast, implant energies of about 250 keV and greater provide a threshold that is independent of polysilicon and oxide thickness up to about 5250 Å, and drops only about 200 mV in the next 250 Å. The reason for the improved threshold insensitivity to the polysilicon-oxide thickness is that a significant portion of the implanted Gaussian charge distribution achieved with the high energy implant lies within the silicon and within the electrostatic control of the gate.

Figure 10:
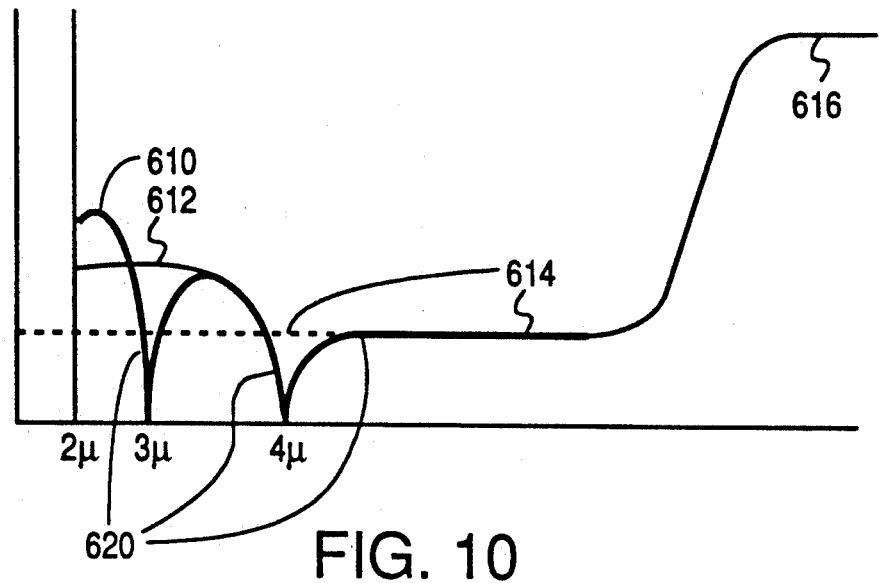
FIG. 10 is a graph of p-type and n-type dopant profiles and the composite profile under the gate region of the VDMOS strip of FIG. 1, resulting from the implant shown in FIG. 7 when the n-body region becomes completely converted.
Figure 11:
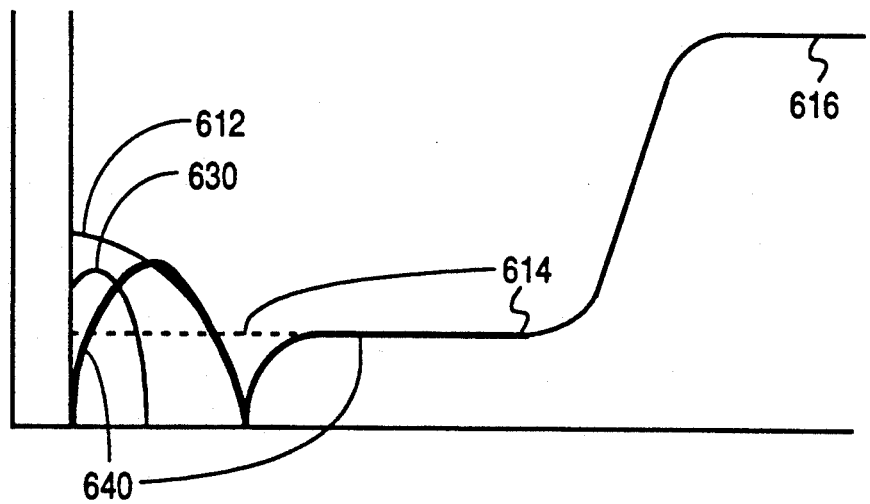
FIG. 11 is a graph of p-type and n-type dopant profiles and the composite dopant profile under the gate region of the VDMOS strip of FIG. 1, resulting from the implant shown in FIG. 7 when the n-body concentration is depressed but not converted.

Illustrative p-type and n-type dopant profiles and the resulting composite profiles of charges under the gate region of the VDMOS strip of FIG. 1 for two different threshold adjust implants are shown in FIGS. 10 and 11. The profiles of FIG. 10 are illustrative of a device the threshold of which is greatly adjusted. Curve 612 represents the n− body concentration, curve 614 represents the p− epitaxial concentration, and curve 616 represents the p+ water concentration. The $V_{tp}$ adjust implant is represented by curve 610, which is hidden by a portion of the composite profile 620. As shown by the composite profile 620, the n-body is completely converted. The profiles of FIG. 11 are illustrative of a device the threshold of which is not greatly adjusted. As in FIG. 10, curve 612 represents the n− body concentration, curve 614 represents the p− epitaxial concentration, and curve 616 represents the p+ substrate concentration. The $V_{tp}$ adjust implant is represented by curve 630. As shown by the composite profile 640, the n-body concentration is depressed but not converted.

The devices of FIGS. 10 and 11 are both effectively threshold-adjusted. The integral of the total charge over the area within electrostatic control of the gate is determinative of threshold voltage. Typically, the gate of a 5 volt device exerts electrostatic control a distance of about 0.5 to 1.5 μm into the silicon, through about 0.1 μm of gate oxide. It is this region into which the threshold adjust charge should be placed. Charge placed outside of this region does not participate in threshold adjustment, and if not fully depleted will cause leakage. The charge in the region converted to p-type by the high energy $V_{tp}$ threshold adjust implant is completely depleted at $V_{gs}=0$, which avoids leakage in the PMOS enhancement mode device. In contrast, the implant dose needed in a conventional channel doping technique to provide the same degree of threshold adjust following the body diffusion would be so large and its diffusion so extensive that the resulting charge would not be fully depleted at $V_{gs}=\phi$. Hence, leakage would occur.

The values of the parameters of (a) the thicknesses of the polysilicon gate and gate oxide films; (b) the implant energy; and (c) the implant dose are set to place a significant portion of the implanted gaussian charge distribution achieved with the high energy implant within the silicon and within the electrostatic control of the gate. Less implant energy is needed for a thinner gate structure, while greater implant energy is needed for a thicker gate structure. Generally, implant energies in the range of 150 keV to 350 keV are suitable for the polysilicon-oxide thicknesses ordinarily encountered. Polysilicon typically ranges from 3,000 Å to 7,000 Å, while gate oxide typically ranges from 200 Å to 1300 Å. Some processes are able to realize gate oxides as thin as 50 Å, and the high energy threshold implant technique is entirely satisfactory for use in such processes.

It will be appreciated that the final resulting threshold of a high energy implant adjusted device may be either positive or negative, meaning that the device after threshold adjustment may be either enhancement mode (normally off) or depletion mode (normally on). Whether enhancement mode or depletion mode, the gate of the threshold adjusted device is capable of being biased (either positive or negative) so as to turn the device completely off. In other words, conduction within the implanted region remains within electrostatic control of the gate.

Figure 12:
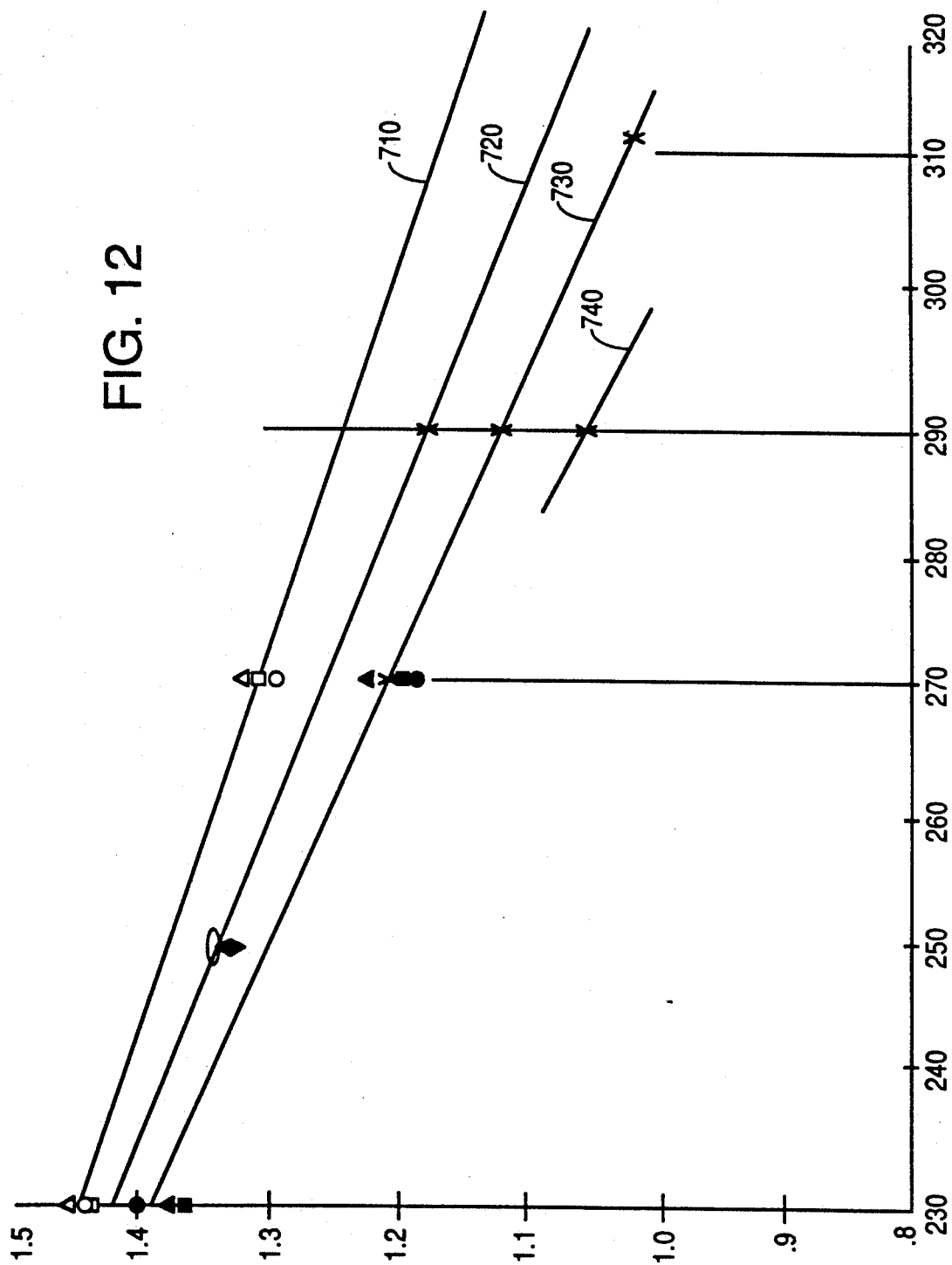
FIG. 12 is a graph showing the change in threshold voltage as a function of boron dose, for implant energies of 230 keV, 250 keV, and 270 keV.

FIG. 12 show $V_{tp}$ in volts (vertical axis, in 0.1 volt increments) as a function of the implant energy in keV (horizontal axis, in 10 keV increments) for lines of constant dose. The MOSFET gate oxide is 580 Å in thickness. The gate electrode is 5000 Å of polysilicon doped n-type after deposition with phosphorus. The unadjusted threshold $V_{to}$ extracted in the saturation region is 1.74 volts. The lines represent a straight line fit to measured values (denoted by various points noted on the graph) for various constant implant dose condition. Specifically, line 710 represents a threshold adjust dose of $7.4 \times 10^{11}$ atoms/cm², line 720 represents a threshold adjust dose of $8.0 \times 10^{11}$ atoms/cm², line 730 represents a threshold adjust dose of $8.6 \times 10^{11}$ atoms/cm², and line 740 represents a threshold adjust dose of $9.2 \times 10^{11}$ atoms/cm².

The various symbols representing measured data points refer to several experimental fabrication test runs. Measurements on these physical devices agree well with the predicted linear threshold dependence on implant dose and energy, which evidences the desired characteristic of independence from variations in gate polysilicon and gate oxide thickness.

Note also that a given threshold can be achieved by different combinations of dose and energy. Since threshold variability tends to be greater at higher doses, threshold variability can be minimized by selecting a relatively high energy, low dose implant to achieve a given threshold.

Figure 13:
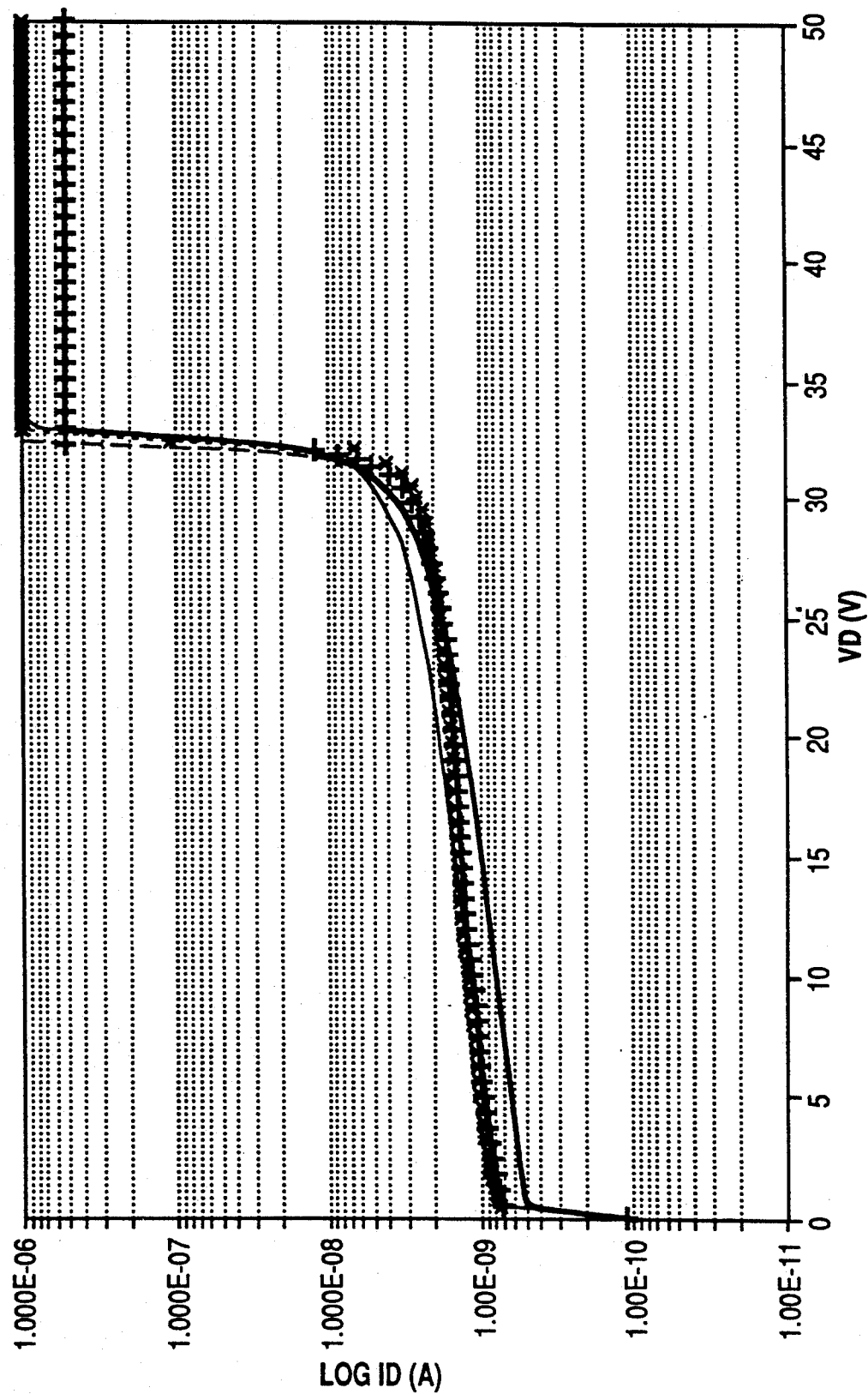
FIG. 13 is a graph showing measured values of leakage drain current versus drain voltage for a variety of similarly constructed enhancement made devices having different threshold adjust implants.

FIG. 13 shows a graph of measured values of leakage drain current versus drain voltage for a variety of similarly constructed enhancement mode devices having different threshold adjust implants. The device characteristics were measured at a high temperature of 150° C. The thin solid line represents behavior of a device having a threshold adjust implant of $8.6 \times 10^{11}$ atoms/cm² boron at 270 keV, the line marked with "+" represents behavior of a device having a threshold adjust implant of $8.0 \times 10^{11}$ atoms/cm² boron at 290 keV, the line marked with "×" represents behavior of a device having a threshold adjust implant of $9.2 \times 10^{11}$ atoms/cm$^2$ boron at 290 keV, the dashed line represents behavior of a device having a threshold adjust implant of $8.6 \times 10^{11}$ atoms/cm$^2$ boron at 310 keV, and the thick solid line represents behavior of a device having no threshold adjust implant. The graph shows that the characteristics of the threshold adjusted devices are comparable to the characteristics of the unadjusted devices, which is to say that none of the devices had significant leakage up to breakdown.

The thickness of field oxide used to mask regions that need to be protected from the high energy p+ threshold adjust implant depends on the implant energy, following a relationship that is well known in the art. For example, according to the previously referenced work Semiconductor Technology Handbook, (graph entitled "Masking Thickness Required, Boron and Antimony Implants") about 1.2 μm of oxide is needed to limit the transmission of boron implanted at 250 keV to 0.0001%. For implant energies in the range of 150 keV to 350 keV, the oxide thickness ranges from about 0.85 μm to about 1.4 μm. Since field oxide is grown to a thickness in excess of 1 μm, suitable protection is achieved without significantly altering the process.

In carrying out the threshold adjust process steps described herein, the high energy threshold implant is made with any suitable ion implanter such as, for example, the 3MeV singly ionized implanter available from Genus Incorporated, Mountain View, Calif. While other types of implanters such as doubly-ionized implanters can achieve the desired energy and can be used if desired, some models exhibit high degrees of variability which may be excessive for threshold adjust implanting. Some implanters, such as the model 350D available from Varian Corporation, Palo Alto, Calif., provide an adequate vacuum for accurately controlling the implant.

Refer now to the three dimensional, cut-away view of a VDMOS field effect transistor shown in FIG. 1. The basic transistor is in place following the threshold adjust implant 94. The integrated circuit 1 is completed by removing all unprotected oxide, including oxide 52 over the source 84 and the oxide cap 36, in a wet etch. A new, thin layer of oxide (not shown) is thermally grown, and a thicker layer of phosphorus doped silicon dioxide 4, or phosphosilicate glass, is deposited and reflowed. Photoresist is deposited and patterned, and the phosphosilicate glass 4 and underlying thermal oxide are etched down to the epitaxial layer 20 over the deep n+ region 40 and the source region 84 to form source contact windows 6, and down to the polysilicon layer 60 (not shown) to form gate contact windows (not shown). Aluminum is deposited using any suitable technique such as evaporation. Photoresist (not shown) is deposited and patterned, and the aluminum is etched to form separate source contact metal 8, gate contact metal (not shown), and field rings (not shown) if desired at the periphery of the integrated circuit 1. A further passivation layer of phosphosilicate glass (not shown) is deposited. Photoresist (not shown) is deposited and patterned, and the passivation layer is etched to form openings to portions of the aluminum that serve as bonding pads to the various metal interconnects. A drain contact is made by evaporating a suitable conductor such as chromium, nickel, aluminum, or a combination thereof on the reverse side of the wafer 10 (not shown). The wafer is scribed, cut, and the resulting chips packaged. Note that none of these operations subsequent to the threshold adjust implant is of sufficiently high temperature or long duration to significantly diffuse the p-type dopant implanted in the channel region threshold implant 94.

While the invention has been described with respect to the embodiments set forth above, other embodiments and variations not described herein may be within the scope of the invention. For example, the invention is not to be considered limited to the specific process described, or limited to the ranges or specific values of process parameters specified, as specific parameter values depend on the characteristics desired of the integrated circuit devices in a manner well known in the art. Accordingly, other embodiments, variations and improvements not described herein may be within the scope of the invention, which is defined by the following claims.

What is claimed is:

1. A method of forming a threshold-adjusted vertical diffused field-effect transistor from a semiconductor body having a first region of a first conductivity type, the method comprising the steps of:

forming a gate, which comprises a patterned conductive gate layer, over an upper surface of the first region;

introducing a first dopant of a second conductivity type opposite to the first conductivity type into part of the first region through its upper surface, the gate acting as a mask to substantially prevent the first dopant from directly entering material of the semiconductor body below the gate layer;

diffusing the first dopant outward to form a second region of the second conductivity type situated laterally within the first region and extending partway under the gate layer;

introducing a second dopant of the first conductivity type into part of the second region through its upper surface to define a location for a third region of the first conductivity type situated laterally within the second region, the gate acting as a mask to substantially prevent the second dopant from directly entering material of the semiconductor body below the gate layer, a channel of the transistor being situated in the second region along its upper surface blow the gate layer and extending from the third region to material of the first region outside the second region, conduction by minority carriers in the channel being subject to electrostatic control of the gate layer;

implanting ions containing a third dopant of the first conductivity type through the gate and into the channel such that nearly all the ions which enter the gate lodge in the channel; and forming contacts to the gate layer and the first region.

2. A method as in claim 1 wherein the gate includes a thin insulative layer situated between the gate layer and the first region.

3. A method as in claim 2 further including the step of diffusing the second dopant to form the third region.

4. A method as in claim 2 wherein the semiconductor body is silicon, the gate layer is doped polysilicon, the insulative layer is silicon dioxide, the gate has a thickness of about 0.5 micron, and the implanting step is done at an energy greater than about 210 keV.

5. A method as in claim 2 wherein the semiconductor body is silicon, the gate layer is doped polysilicon, the insulative layer is silicon dioxide, the gate has a thickness of about 0.3–0.8 micron, and implanting step is done at an energy of about 150–350 keV.

6. A method as in claim 2 wherein the semiconductor body is silicon, the gate layer is doped polysilicon, the insulative layer is silicon dioxide, the gate has a thickness of about 0.6 micron, and the implanting step is done at an energy of about 230–320 keV and at a dose of about $7 \times 10^{11}$–$9.2 \times 10^{11}$ atoms/cm$^2$.

7. A method as in claim 1 wherein the implanting step is performed at a dose such that the transistor is an enhancement-mode device.

8. A method as in claim 1 wherein the implanting step is performed at a dose such that the transistor is a depletion-mode device.

9. A method of forming a threshold-adjusted P-channel VDMOS field-effect transistor, the method comprising the steps of:

forming a patterned conductive gate layer on an insulative layer situated along an upper surface of a main P-type region of a semiconductor body;

introducing an N-type dopant into part of the main region through its upper surface, the gate and insulative layers acting as a mask to substantially prevent the N-type dopant from directly entering material of the semiconductor body below the gate layer;

deeply diffusing the N-type dopant to form an N-type body region situated laterally within the main region and extending partway under the gate layer up to the insulative layer;

introducing a first P-type dopant into the body region through its upper surface the gate and insulative layers acting as a mask to substantially prevent the P-type dopant from directly entering material of the semiconductor body below the gate layer;

deeply diffusing the first P-type dopant to form a P-type source region situated within the body region, a channel of the transistor situated in the body region along its upper surface below the gate layer and extending from the source region to material of the main region outside the body region, conduction by minority carriers in the channel being subject to electrostatic control of the gate layer;

implanting ions containing a second P-type dopant through the gate and insulative layers and into the channel such that nearly all the ions which enter the gate layer lodge in the channel; and forming contacts to the gate layer, the source region, and the main region.

10. A method as in claim 9 wherein the gate and insulative layers have a composite thickness of about 03.–0.8 micron, and the implanting step is done at an energy of about 150–350 keV.

* * * * *

UNITED STATES PATENT AND TRADEMARK OFFICE
CERTIFICATE OF CORRECTION

PATENT NO.    :  5,248,627
DATED         :  September 28, 1993
INVENTOR(S)   :  Richard K. Williams It is certified that error appears in the above-identified patent and that said Letters Patent is hereby corrected as shown below:

Col. 5, line 47, delete "0." and substitute --O.--;

Col. 6, line 26, after "not", insert --materially--;

Col. 7, line 39, delete "water" and substitute --wafer--;

Col. 8, line 1, delete "φ" and substitute --0--.

Signed and Sealed this

Fifteenth Day of November, 1994

Attest:

BRUCE LEHMAN

Attesting Officer    Commissioner of Patents and Trademarks